(12) United States Patent
Lu et al.

(10) Patent No.: US 9,620,420 B2
(45) Date of Patent: Apr. 11, 2017

(54) SEMICONDUCTOR ARRANGEMENT AND FORMATION THEREOF

(71) Applicant: Taiwan Semiconductor Manufacturing Company Limited, Hsin-Chu (TW)

(72) Inventors: Chen-Hung Lu, Hsinchu (TW); Chie-luan Lin, Zhubei (TW); Ming-Yi Lin, Hsinchu (TW); Yen-Sen Wang, Hsinchu (TW); Jyh-Kang Ting, Baoshan Township (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 15/160,257

(22) Filed: May 20, 2016

(65) Prior Publication Data
US 2016/0268170 A1 Sep. 15, 2016

Related U.S. Application Data

(62) Division of application No. 14/186,141, filed on Feb. 21, 2014, now Pat. No. 9,349,634.

(51) Int. Cl.
*H01L 21/8234* (2006.01)
*H01L 21/768* (2006.01)
(Continued)

(52) U.S. Cl.
CPC ........... *H01L 21/823475* (2013.01); *H01L 21/76802* (2013.01); *H01L 21/76816* (2013.01); *H01L 21/76877* (2013.01); *H01L 21/76895* (2013.01); *H01L 21/823418* (2013.01); *H01L 21/823431* (2013.01); *H01L 21/823481* (2013.01); *H01L 23/481* (2013.01); *H01L 27/088* (2013.01); *H01L 29/0653* (2013.01);
(Continued)

(58) Field of Classification Search
CPC ....... H01L 21/823475; H01L 21/76802; H01L 21/76877; H01L 29/45; H01L 29/0653; H01L 23/481; H01L 27/088; H01L 21/76895; H01L 21/76816; H01L 21/823418; H01L 21/823481; H01L 29/66545
See application file for complete search history.

(56) References Cited

U.S. PATENT DOCUMENTS

| | | | | |
|---|---|---|---|---|
| 7,294,544 B1 * | 11/2007 | Ho | ....................... | H01L 21/8221 257/296 |
| 2006/0226474 A1 * | 10/2006 | Ho | ........................ | H01L 27/115 257/326 |
| 2012/0199911 A1 * | 8/2012 | Disney | ................ | H01L 29/4236 257/365 |

* cited by examiner

*Primary Examiner* — Long Pham
(74) *Attorney, Agent, or Firm* — Cooper Legal Group, LLC

(57) ABSTRACT

A semiconductor arrangement and method of formation are provided. The semiconductor arrangement includes a metal connect over and connected to a first active region, over and connected to a second active region and over a shallow trench isolation (STI) region thereby connecting the first active region to the second active region. A metal contact is over and connected to a gate in the STI region. The metal connect is formed in a first opening and the metal contact is formed in a second opening, where the first opening and the second opening are formed concurrently using a single mask. The semiconductor arrangement formed using a single mask is less expensive to fabricate and requires fewer etching operations than a semiconductor arrangement formed using multiple masks.

20 Claims, 11 Drawing Sheets

(51) Int. Cl.
*H01L 29/45* (2006.01)
*H01L 29/06* (2006.01)
*H01L 23/48* (2006.01)
*H01L 27/088* (2006.01)
*H01L 29/66* (2006.01)

(52) U.S. Cl.
CPC ........ *H01L 29/45* (2013.01); *H01L 29/66545* (2013.01); *H01L 27/0886* (2013.01); *H01L 2924/0002* (2013.01)

SEMICONDUCTOR ARRANGEMENT AND FORMATION THEREOF

RELATED APPLICATION

This application is a divisional of and claims priority to U.S. patent application Ser. No. 14/186,141, titled "SEMICONDUCTOR ARRANGMENT AND FORMATION THEREOF" and filed on Feb. 21, 2014, which is incorporated herein by reference.

BACKGROUND

A semiconductor arrangement comprises one or more semiconductor devices. In a semiconductor device, such as a transistor, current flows through a channel region between a source region and a drain region upon application of a sufficient voltage or bias to a gate of the device. When current flows through the channel region, the device is generally regarded as being in an 'on' state, and when current is not flowing through the channel region, the device is generally regarded as being in an 'off' state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
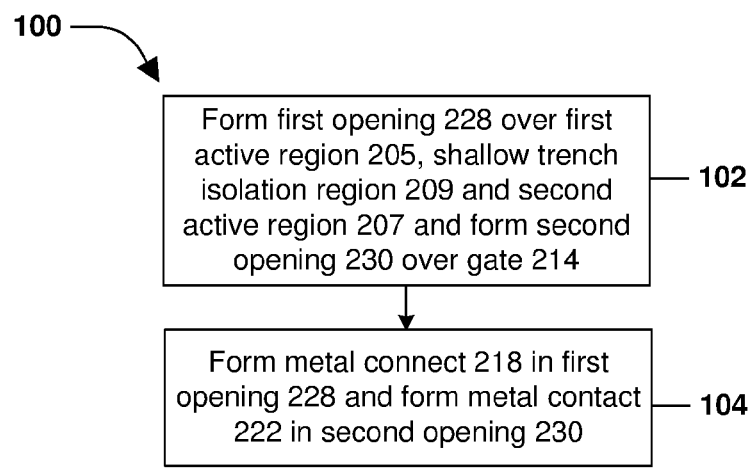
FIG. 1 is a flow diagram illustrating a method of forming a semiconductor arrangement, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor arrangement and resulting structures formed thereby are provided herein.

Figure 17:
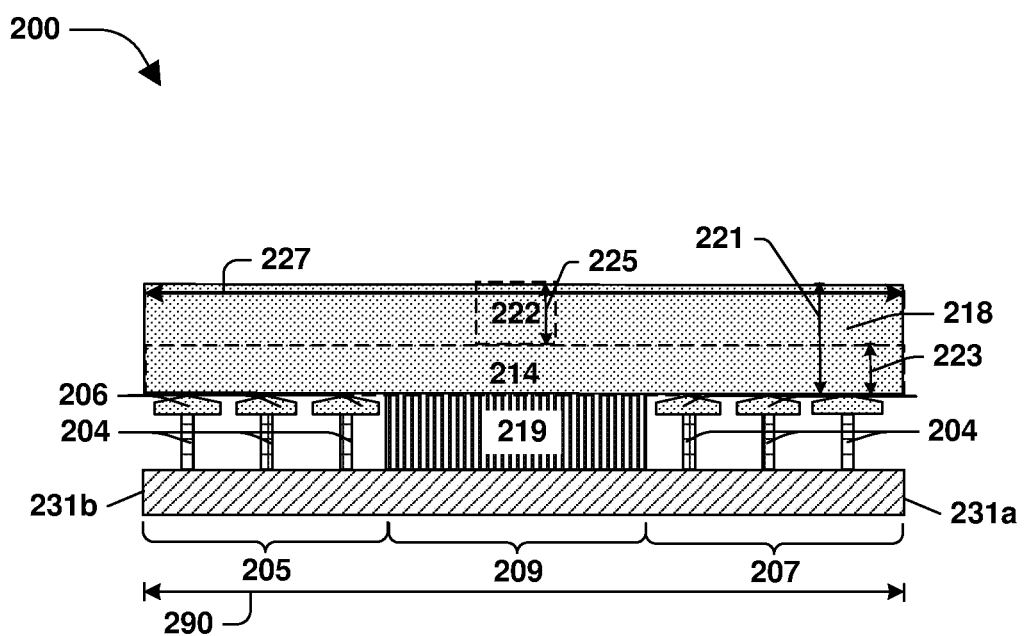
FIG. 17 is an illustration of a semiconductor arrangement, in accordance with some embodiments.
Figure 18:
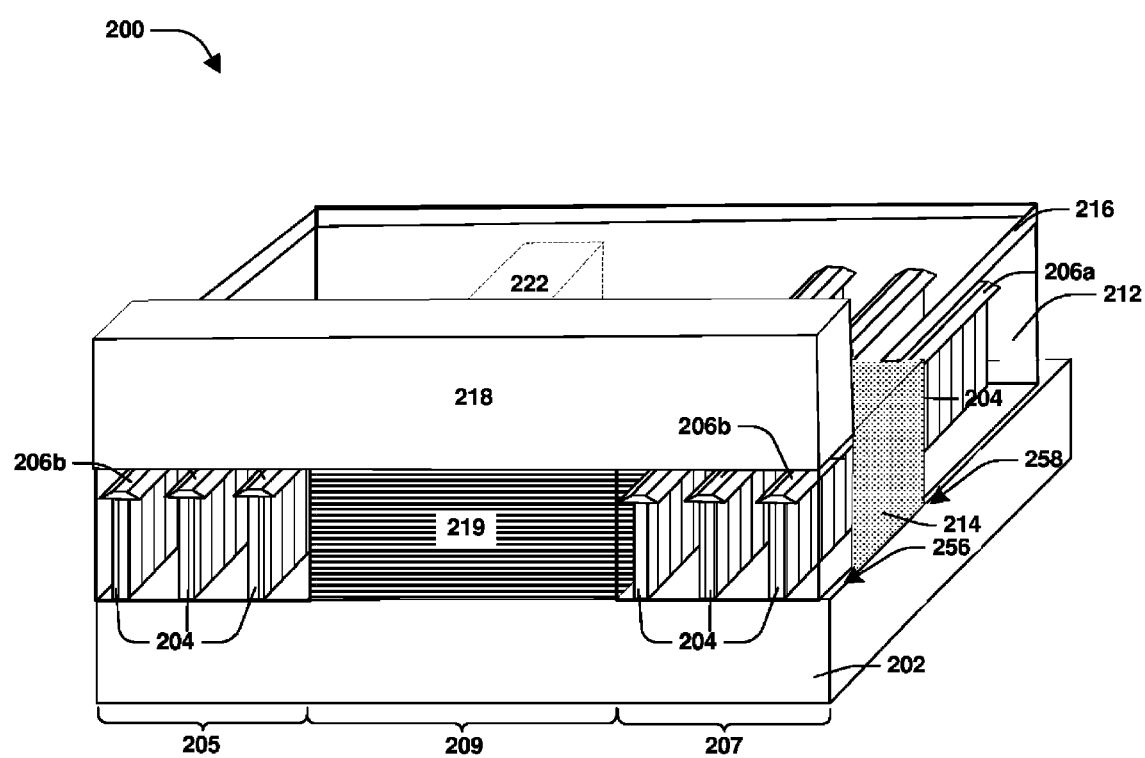
FIG. 18 is an illustration of a semiconductor arrangement, in accordance with some embodiments.

A method 100 of forming a semiconductor arrangement 200 according to some embodiments is illustrated in FIG. 1 and one or more structures formed thereby at various stages of fabrication are illustrated in FIGS. 2-18. According to some embodiments, such as illustrated in FIG. 18, the semiconductor arrangement 200 comprises a first active region 205, a second active region 207 and a shallow trench isolation (STI) region 209, the STI region 209 between the first active region 205 and the second active region 207. According to some embodiments, a metal connect 218 is over the first active region 205, the second active region 207 and the STI region 209 and connected to the first active region 205 and the second active region 207. In some embodiments, a metal contact 222 is over and connected to a gate 214 in the STI region 209. In some embodiments, the metal connect 218 is formed in a first opening 228 illustrated in FIG. 12 and the metal contact 222 is formed in a second opening 230 illustrated in FIG. 12, where the first opening 228 and the second opening 230 are formed concurrently using a single mask. In some embodiments, a semiconductor arrangement formed using a single mask is less expensive to fabricate than a semiconductor arrangement formed using multiple masks. In some embodiments, a semiconductor arrangement formed using a single mask requires fewer etching operations than a semiconductor arrangement formed using multiple masks.

Figure 2:
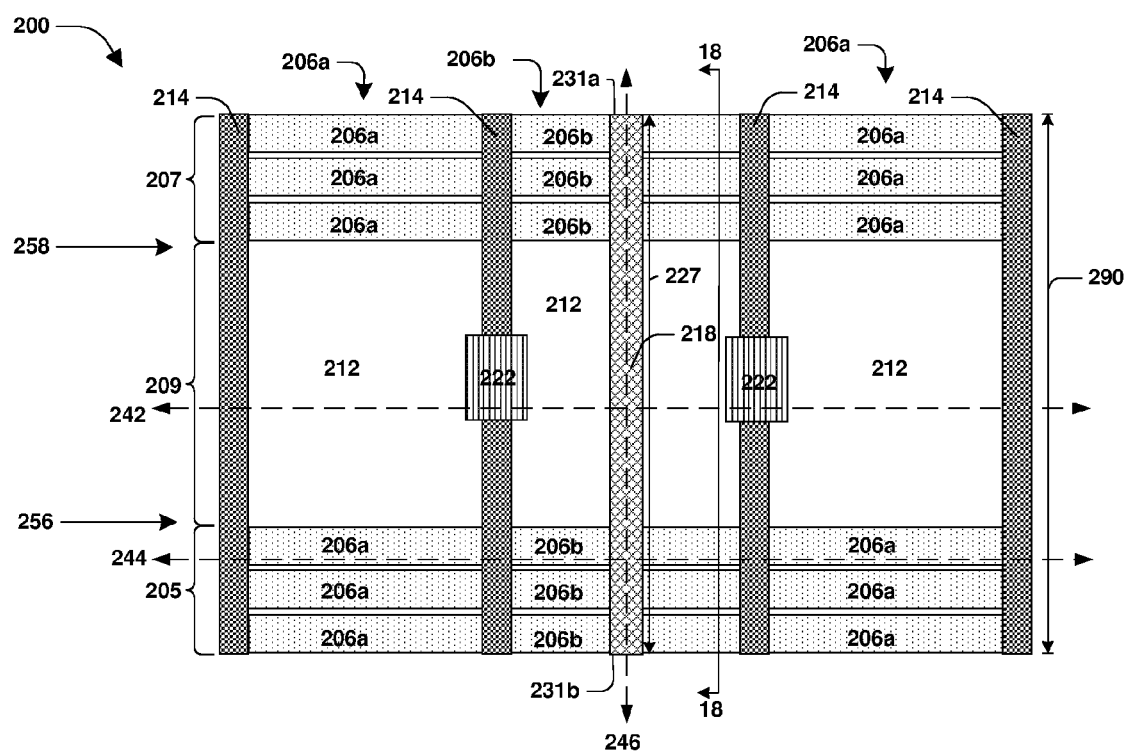
FIG. 2 is an illustration of a semiconductor arrangement, in accordance with some embodiments.

Turning to FIG. 2 an overview or top down view of the semiconductor arrangement 200 is illustrated according to some embodiments, where a second dielectric layer 220 illustrated in FIGS. 9-16 and a first sidewall spacer 210a and a second sidewall spacer 210b illustrated in FIGS. 3-16 are not shown in FIG. 2 so that features underlying the second dielectric layer 220, the first sidewall spacer 210a and the second sidewall spacer 210b are visible in FIG. 2. In FIG. 2 three lines 242, 244 and 246 are drawn to illustrate cross-sections that are depicted in other FIGS. A first line 242 cuts through the STI region 209, a gate 214 or multiple gates 214, a metal contact 222 or multiple metal contacts 222 and the metal connect 218, where the STI region 209 comprises STI 219, such as illustrated in FIG. 18. FIGS. 4, 6, 8, 10, 12, 14 and 16 are cross sectional views of the semiconductor arrangement 200 taken along the first line 242 at various stages of fabrication, where merely two gates 214 are illustrated for simplicity. A second line 244 cuts through the first active region 205, the multiple gates 214 and the metal connect 218, where the first active region 205 is a region where as at least one of a source or a drain are formed, according to some embodiments. FIGS. 3, 5, 7, 9, 11, 13 and 15 are cross sectional views of the semiconductor arrangement 200 taken along the second line 244 at various stages of fabrication, where merely two gates 214 are illustrated for simplicity. A third line 246, cuts through the metal connect 218, according to some embodiments, where the metal connect 218 is formed to connect the first active region 205 to the second active region 207. FIG. 17 is a cross sectional view of the semiconductor arrangement 200 taken along the third line 246 at a latter stage of fabrication.

Figure 3:
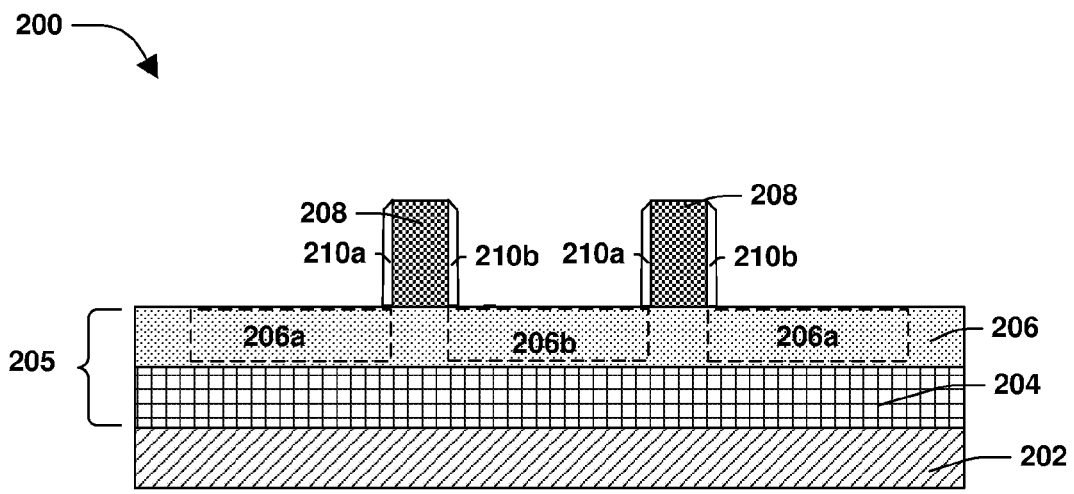
FIG. 3 is an illustration of a semiconductor arrangement, in accordance with some embodiments.
Figure 4:
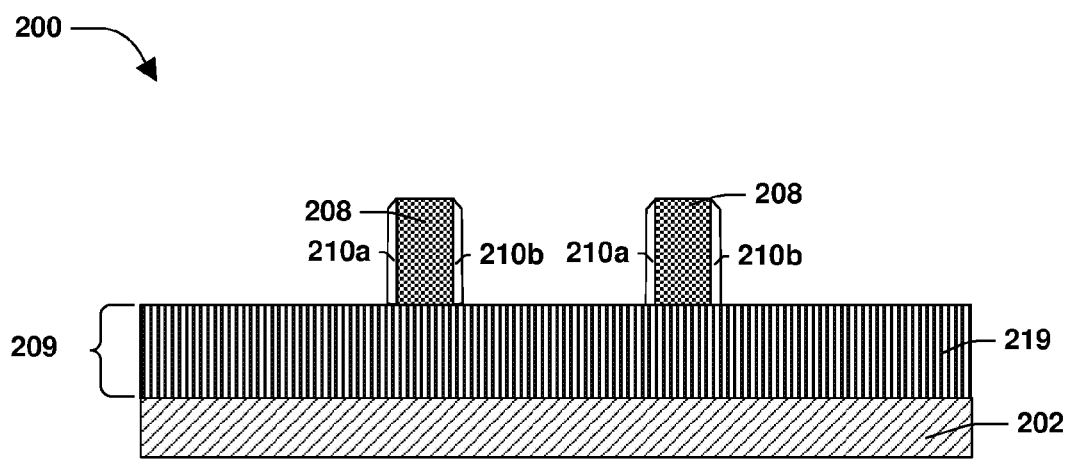
FIG. 4 is an illustration of a semiconductor arrangement, in accordance with some embodiments.
Figure 11:
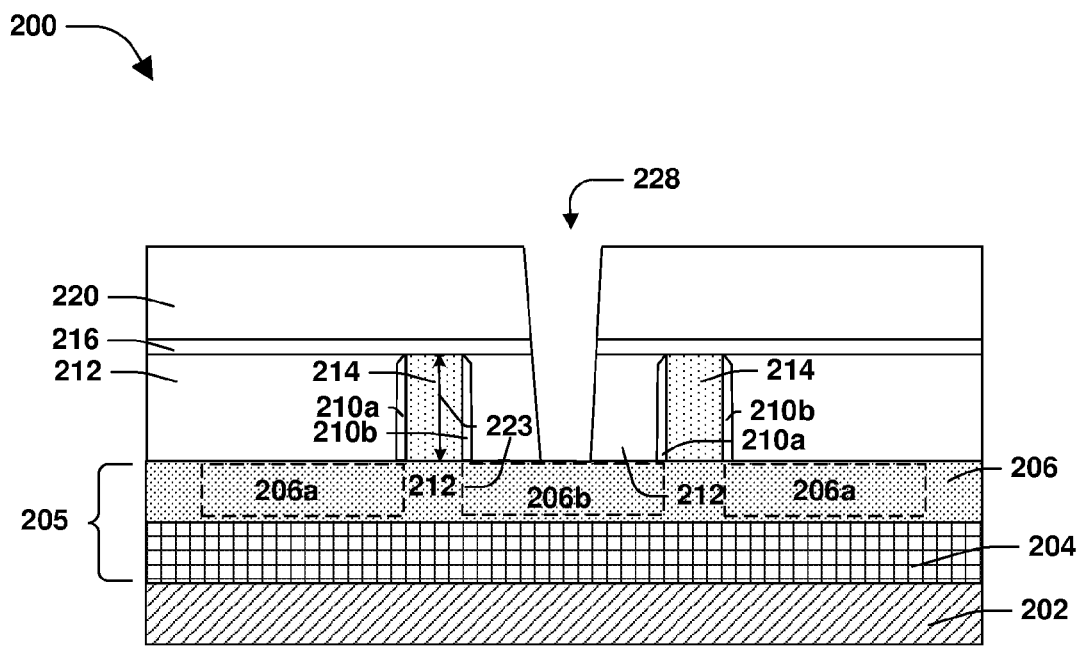
FIG. 11 is an illustration of a semiconductor arrangement, in accordance with some embodiments.
Figure 12:
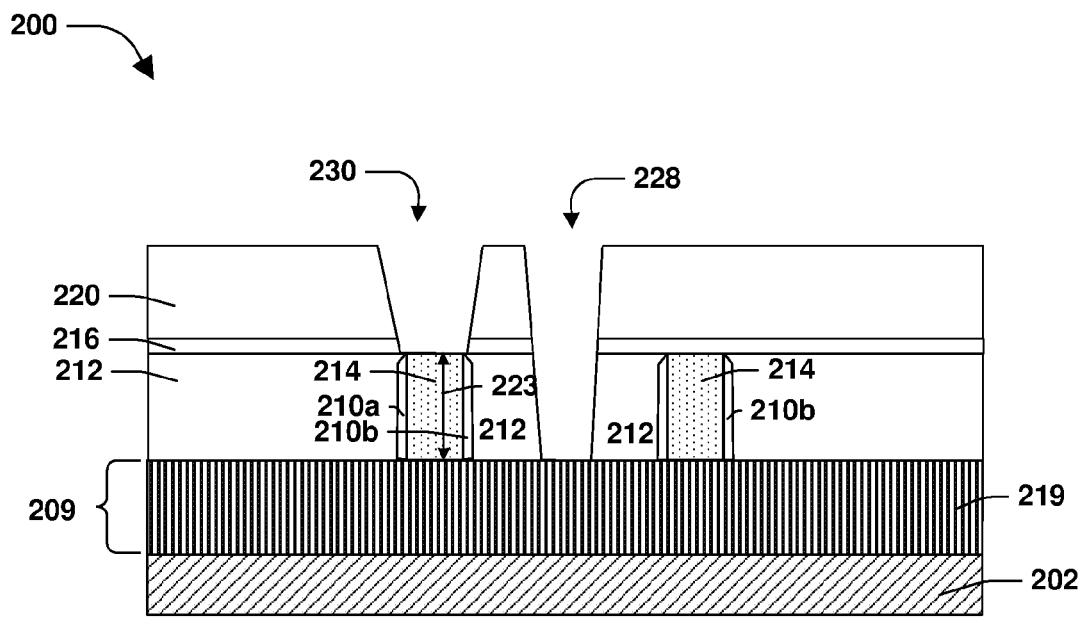
FIG. 12 is an illustration of a semiconductor arrangement, in accordance with some embodiments.

At 102, the first opening 228 is formed over the first active region 205, the STI region 209, and the second active region 207 such that the first opening 228 exposes the first active region 205 and the second active region 207 and the second opening 230 is formed over the gate 214 in the STI region 209, as illustrated in FIGS. 11 and 12, according to some embodiments. Turning to FIG. 3, which illustrates a cross-section of the second line 244 of FIG. 2, where the second line 244 cuts through the first active region 205, and to FIG. 4, which illustrates a cross-section of the first line 242 of FIG. 2, where the first line 242 cuts through the STI region 209. In some embodiments, the semiconductor arrangement 200 is formed upon a substrate 202, and thus comprises at least some of the substrate in some embodiments. In some embodiments, the substrate 202 comprises at least one of silicon or germanium. According to some embodiments, the substrate 202 comprises at least one of an epitaxial layer, a silicon-on-insulator (SOI) structure, a wafer, or a die formed from a wafer. In some embodiments, STI 219 is formed over the substrate 202 in the STI region 209, as illustrated in FIG. 4. In some embodiments, the STI 219 comprises a dielectric material, such as silicon oxide (SiO$_2$). In some embodiments, the STI 219 formation comprises deposition of the dielectric material. In some embodiments, the STI region 209 comprises the STI 219. In some embodiments, the STI 219 has a thickness between about 20 nm to about 70 nm. In some embodiments, one or more fins 204 are formed on the substrate 202 of the first active region 205, as illustrated in FIG. 3. In some embodiments, the one or more fins 204 comprise a same material as the substrate 202. In some embodiments, the one or more fins 204 have a height between 5 nm to about 45 nm. In some embodiments, an epitaxial (Epi) cap 206 is formed over the one or more fins 204. In some embodiments, the Epi cap 206 is grown. In some embodiments, the Epi cap 206 comprises at least one of silicon, germanium, nitride, or oxide. In some embodiments, the second active region 207 is formed substantially the same way as the first active region 205. In some embodiments, the Epi cap 206a comprises at least one of a source or a drain. In some embodiments, the Epi cap 206b comprises a source if the Epi cap 206a comprises a drain, and the Epi cap 206b comprises a drain if the Epi cap 206a comprises a source. In some embodiments, a dummy gate 208 is formed over the first active region 205, as illustrated in FIG. 3 the STI region 209 as illustrated in FIG. 4 and the second active region 207. In some embodiments, the dummy gate 208 comprises a polysilicon. In some embodiments, a first sidewall spacer 210a and a second sidewall spacer 210b are formed such that the dummy gate 208 is between the first sidewall spacer 210a and the second sidewall spacer 210b.

Figure 5:
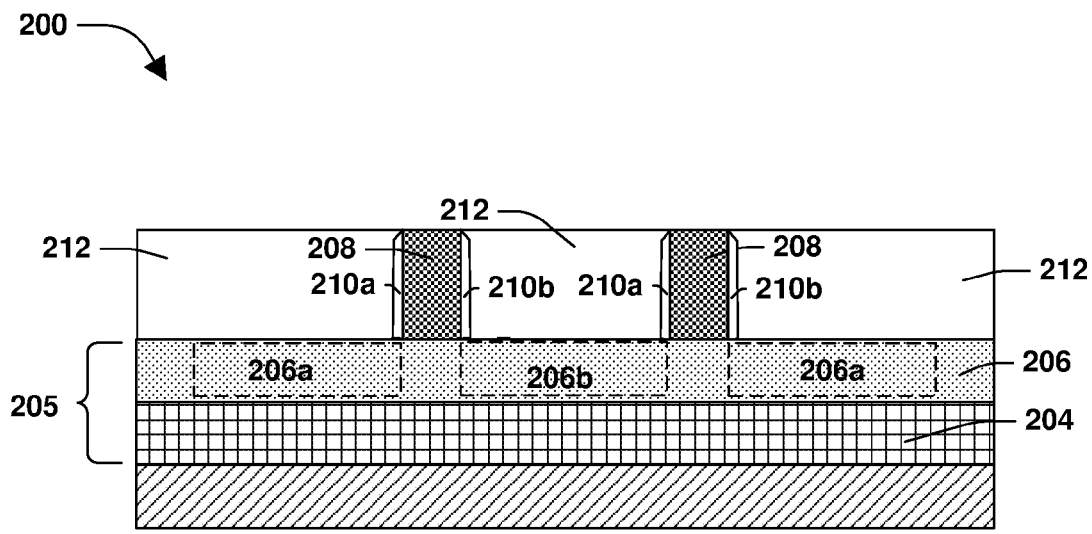
FIG. 5 is an illustration of a semiconductor arrangement, in accordance with some embodiments.
Figure 6:
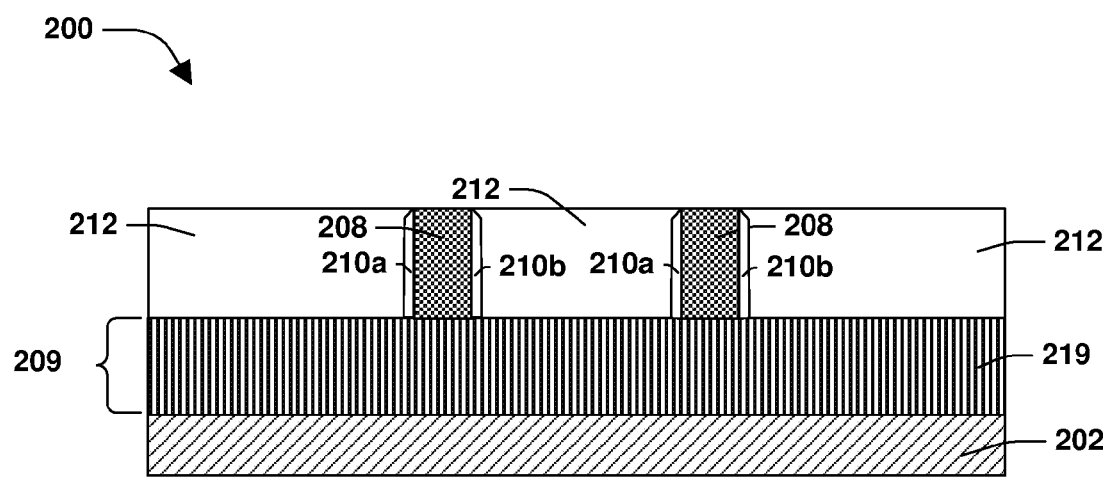
FIG. 6 is an illustration of a semiconductor arrangement, in accordance with some embodiments.

According to some embodiments, a first dielectric layer 212 is formed, such as by deposition, over the dummy gate 208, the first sidewall spacer 210a, the second sidewall spacer 210b, the STI 219 and the Epi cap 206, as illustrated in FIGS. 5, 6 and 18. In some embodiments, the first dielectric layer 212 comprises a standard dielectric material with a medium or low dielectric constant, such as SiO$_2$. In some embodiments, the first dielectric layer 212 has thickness between about 5 nm to about 100 nm. In some embodiments, the first dielectric layer 212 comprises at least one of nitride or oxide. In some embodiments, chemical mechanical planarization (CMP) is performed to remove some of the first dielectric layer 212, such that a top surface of the dummy gate 208 is exposed.

Figure 7:
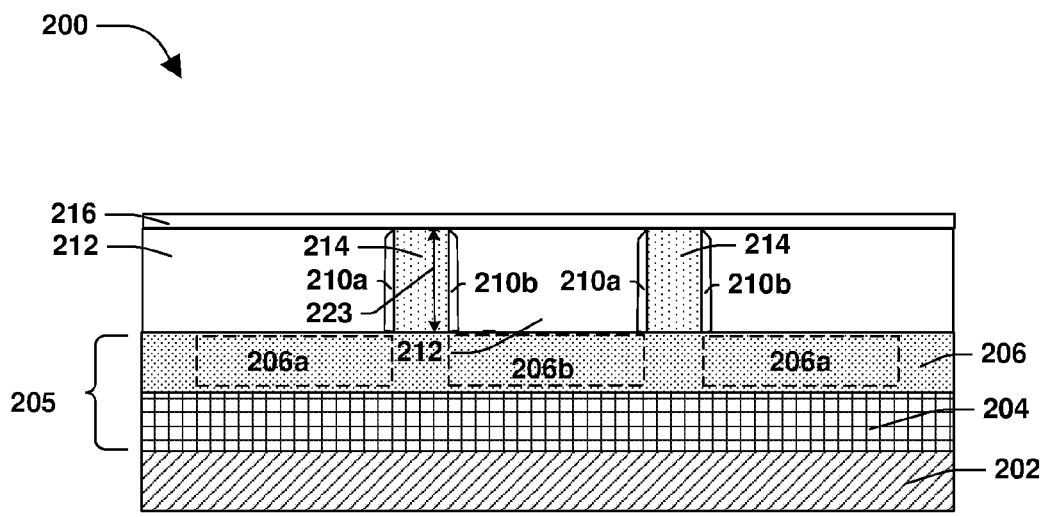
FIG. 7 is an illustration of a semiconductor arrangement, in accordance with some embodiments.
Figure 8:
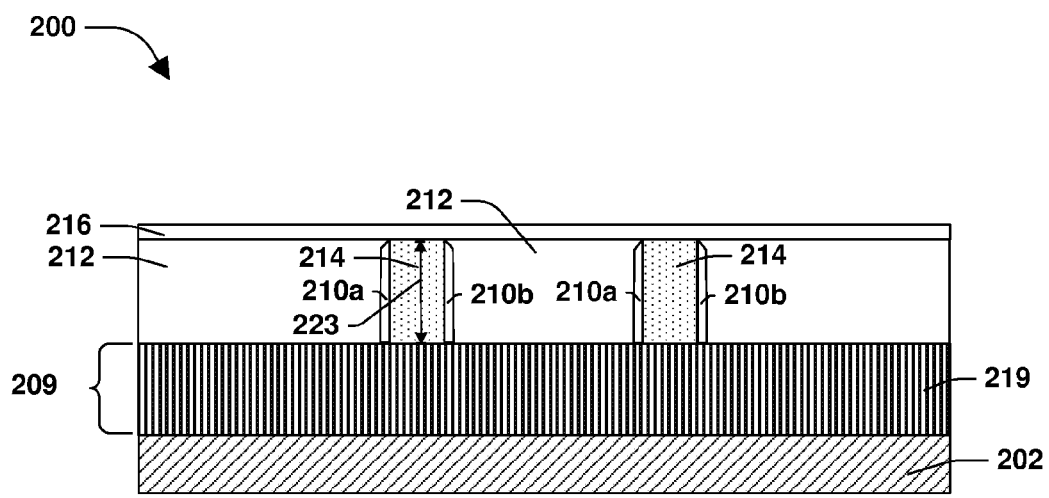
FIG. 8 is an illustration of a semiconductor arrangement, in accordance with some embodiments.

According to some embodiments, the gate 214, or a plurality of gates 214, are formed by removing the dummy gate 208, such as by etching, and forming the gate 214, such as by deposition, between the first sidewall spacer 210a and the second sidewall spacer 210b, as illustrated in FIGS. 7 and 8. In some embodiments, the gate 214 is formed, such that the gate 214 is in contact with the Epi cap 206 of the first active region 205 and the Epi cap 206 of the second active region 207 and over the STI region 209. In some embodiments, the gate 214 comprises a layer of high dielectric constant material in contact with the Epi cap 206 of the first active region 205 and the second active region 207, as illustrated in FIGS. 7 and 18. In some embodiments, the layer of high dielectric constant material comprises at least one of nitride or oxide. In some embodiments, the gate 214 comprises a conductive material, such as metal or polysilicon, formed, such as by deposition, over the high dielectric constant material. In some embodiments, the gate 214 comprises a hard mask formed, such as by deposition, over the conductive material. In some embodiments, the gate 214 has a third height 223 between about 5 nm to about 100 nm. In some embodiments, the hard mask comprises oxide or nitride. In some embodiments, an etch stop layer 216 is formed over the first dielectric layer 212 and the gate 214. In some embodiments, the etch stop layer 216 comprises different etch characteristics or has a different etch selectivity as compared to the first dielectric layer 212 and the second dielectric layer 220.

Figure 9:
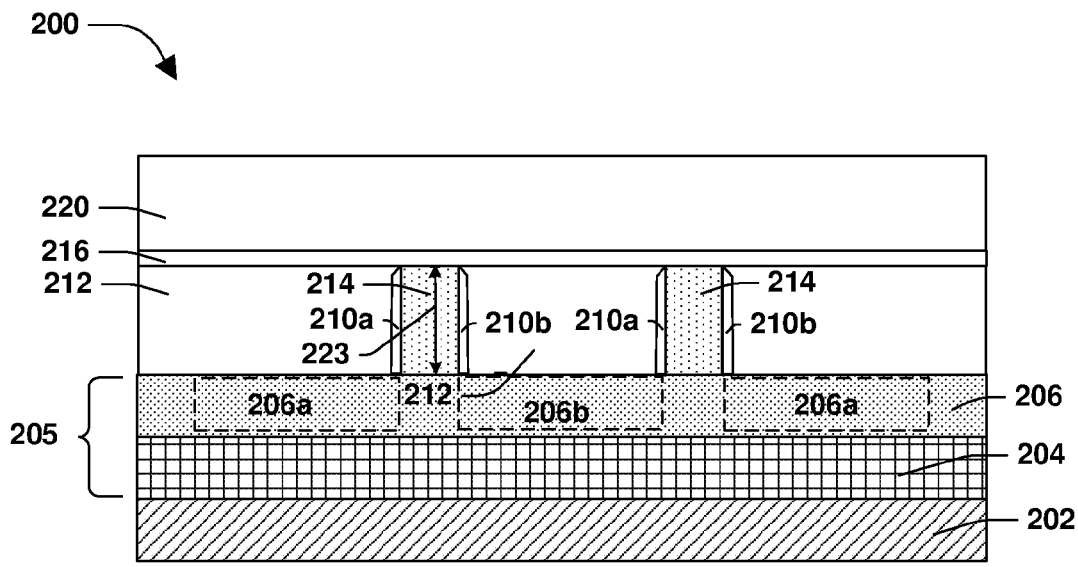
FIG. 9 is an illustration of a semiconductor arrangement, in accordance with some embodiments.
Figure 10:
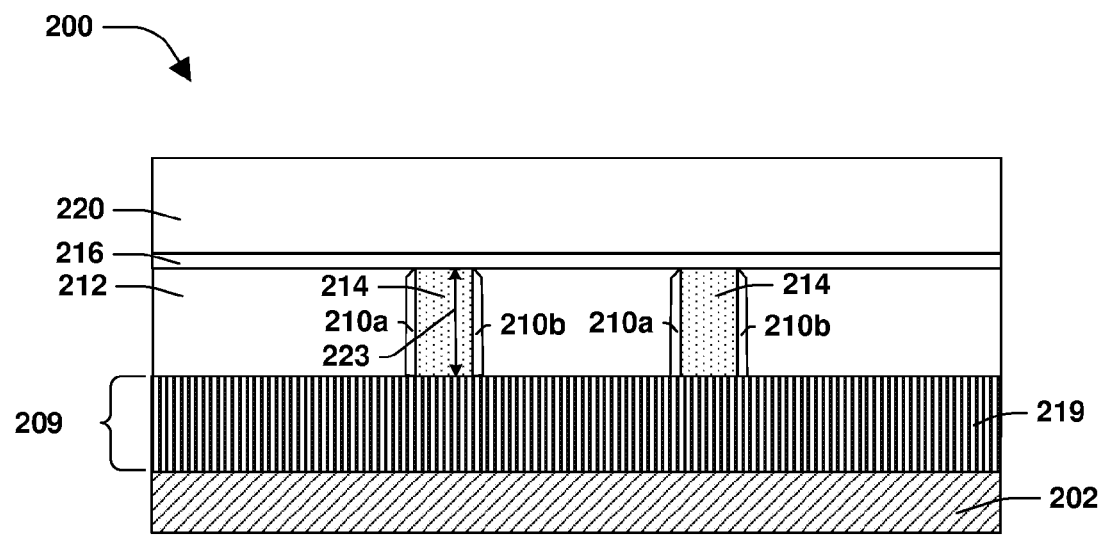
FIG. 10 is an illustration of a semiconductor arrangement, in accordance with some embodiments.

According to some embodiments, the second dielectric layer 220 is formed over the etch stop layer 216, as illustrated in FIGS. 9 and 10. In some embodiments, the second dielectric layer 220 is formed in substantially the same manner as described above with regards to the first dielectric layer 212, as illustrated in FIGS. 5 and 6.

According to some some embodiments, the first opening 228 and the second opening 230 are formed, such as by etching, using a single mask, as illustrated in FIGS. 11 and 12. In some embodiments, the first opening 228 and the second opening 230 are formed concurrently, such as by the same dry etching process. In some embodiments, the first opening 228 is formed in the second dielectric layer 220, the etch stop layer 216 and the first dielectric layer 212, such that the first active region 205 and the second active region 207 are exposed. In some embodiments, the second opening 230 is formed in the second dielectric layer 220 and the etch stop layer 216 in the STI region 209, such that a gate top surface of the gate 214 is exposed, as illustrated in FIG. 12.

Figure 13:
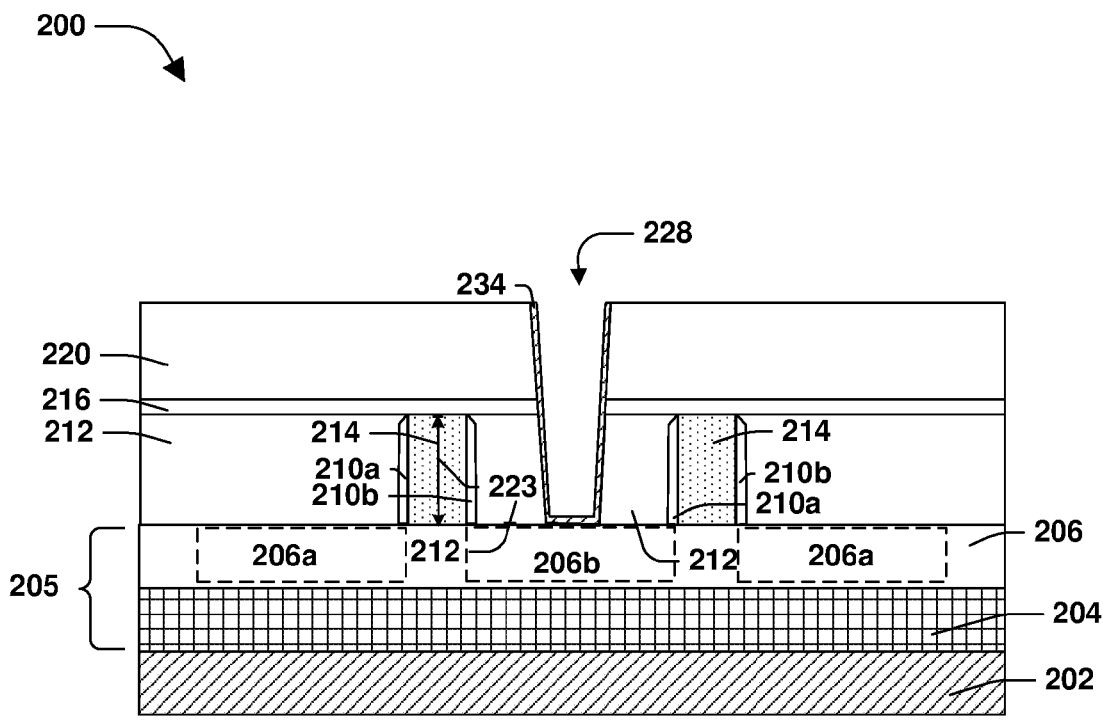
FIG. 13 is an illustration of a semiconductor arrangement, in accordance with some embodiments.
Figure 14:
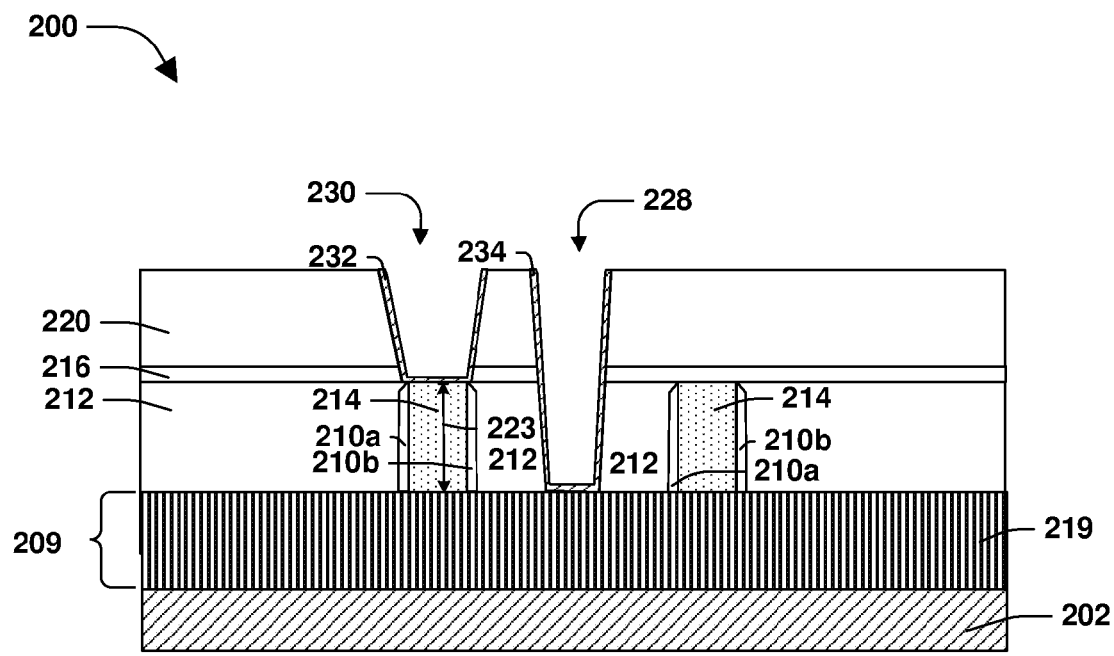
FIG. 14 is an illustration of a semiconductor arrangement, in accordance with some embodiments.
Figure 15:
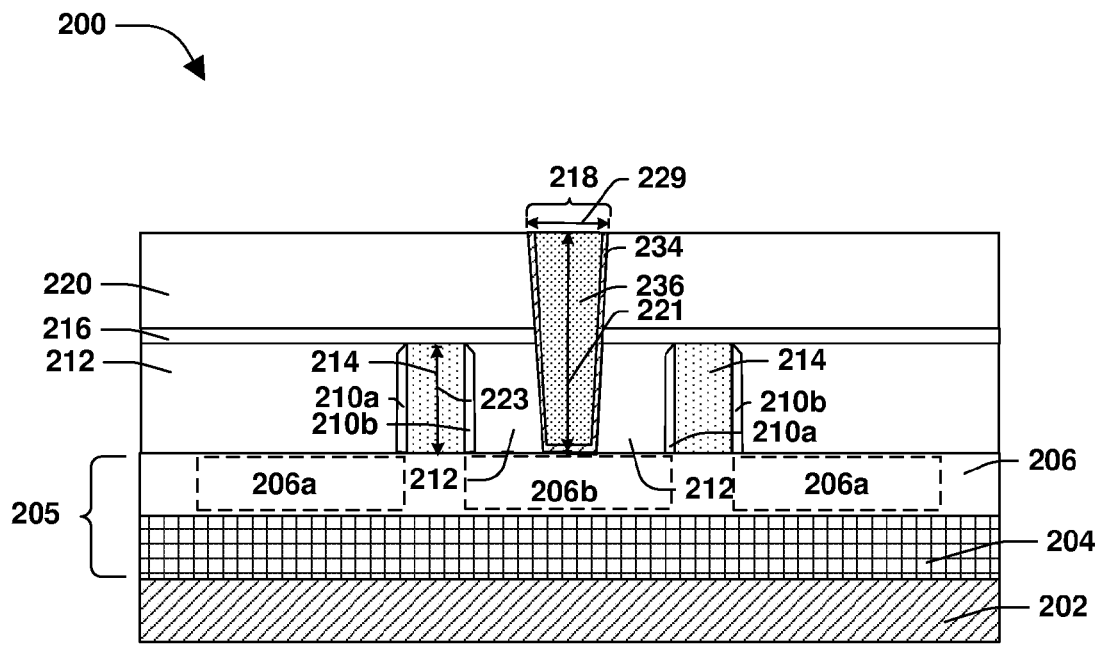
FIG. 15 is an illustration of a semiconductor arrangement, in accordance with some embodiments.
Figure 16:
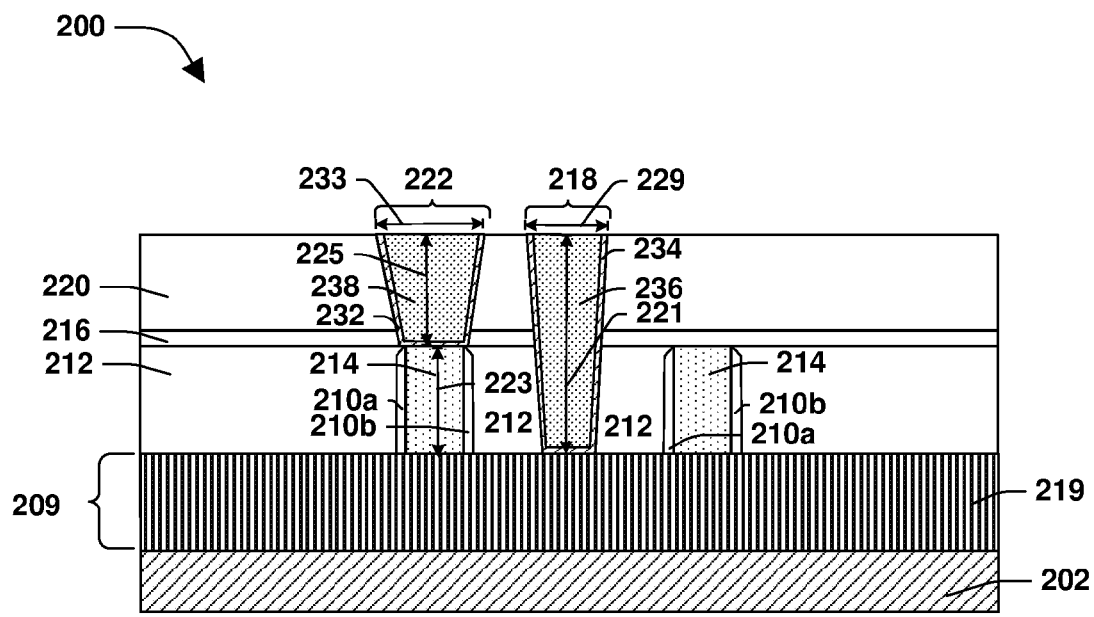
FIG. 16 is an illustration of a semiconductor arrangement, in accordance with some embodiments.

At 104, the metal connect 218 is formed in the first opening 228 and the metal contact 222 is formed in the second opening 230, as illustrated in FIGS. 15 and 16, according to some embodiments. Turning to FIGS. 13 and 14, prior to FIGS. 15 and 16, a first metal layer 234 is formed in the first opening 228, such as by deposition, according to some embodiments. In some embodiments, the first metal layer 234 comprises at least one of titanium or nitride, according to some embodiments. In some embodiments, a second metal layer 232 is formed in the second opening 230, such as by deposition, according to some embodiments. In some embodiments, the second metal layer 232 comprises at least one of titanium or nitride. In some embodiments, the first metal layer 234 and the second metal layer 232 are formed concurrently. In some embodiments, the semiconductor arrangement 200 is annealed, such that the first metal layer 234 forms a suicide with the Epi cap 206 in the first active region 205 and the Epi cap 206 in the second active region 207. In some embodiments, a first metal plug 236 is formed over the first metal layer 234 to form the metal connect 218 and a second metal plug 238 is formed over the second metal layer 232 to form the metal contact 222, as illustrated in FIGS. 15-16. In some embodiments, the first metal plug 236 and the second metal plug 238 are formed concurrently. In some embodiments, the first metal plug 236 comprises tungsten. In some embodiments, the second metal plug 238 comprises tungsten. In some embodiments, excess first metal layer 234, second metal layer 232, first metal plug 236 and second metal plug 238 are removed, such as by CMP. In some embodiments, the metal connect 218 has a first height 221 between about 3 nm to about 100 nm. In some embodiments, the metal connect 218 has a first width 229 between about 5 nm to about 30nm. In some embodiments, the metal contact 222 has a second height 225 between about 2 nm to about 50 nm. In some embodiments, the metal contact 222 has a second width 233 between about 5 nm to about 30 nm. In some embodiments, the first height 221 is greater than the second height 225. In some embodiments, the first height 221 is substantially equal to the sum of the second height 225 and third height 223. In some embodiments, the metal connect 218 connects the first active region 205 to the second active region 207.

Turning to FIG. 17, which illustrates a cross-section of the third line 246 of FIG. 2, where the third line 246 cuts through the metal connect 218, according to some embodiments. In some embodiments, the metal connect 218 has a metal length 227, the metal length 227 is at least one of substantially equal to, less than or greater than a semiconductor arrangement length 290. In some embodiments, the semiconductor arrangement length 290 is measured from a first distal sidewall 231b of the gate 214 to a second distal sidewall 231a of the gate 214.

Turning to FIG. 18, a 3D cross-sectional view of the semiconductor arrangement 200 is illustrated as viewed from a perspective indicated by arrows on line 18-18 in FIG. 2, where the second dielectric layer 220, the first sidewall spacer 210a and the second sidewall spacer 210b are removed. According to some embodiments, the one or more fins 204 with Epi caps 206 pass through the gate 214, such that on a first side 256 of the gate 214, the Epi caps 206b comprises one of a source or a drain and on a second side 258 of the gate 214, the Epi caps 206a comprises a source if the Epi caps 206b comprise a drain or a drain if the Epi caps 206b comprises a source. In some embodiments, the metal connect 218 is formed over the one or more fins 204 with Epi caps 206b in the first active region 205 and the one or fins 204 with Epi caps 206b in the second active region 207. In some embodiments, the STI region 209 comprises the STI 219, where the STI 219 is situated such that the STI 219 separates the one or more fins 204 with Epi caps 206 in the first active region 205 from the one or more fins 204 with Epi caps 206 in the second active region 207. In some embodiments, the metal connect 218 is formed such that the one or more fins 204 with Epi caps 206b in the first active region 205 are connected to the one or more fins 204 with Epi caps 206b in the second active region 207. In some embodiments, the Epi caps 206b in the first active region 205 and the Epi caps 206b in the second active region 207 comprise drains, and thus the metal connect 218 connects a first drain to a second drain. In some embodiments, the Epi caps 206b in the first active region 205 and the Epi caps 206b in the second active region 207 comprise sources, and thus the metal connect 218 connects a first source to a second source. In some embodiments, the semiconductor arrangement 200 formed using a single mask is less expensive to fabricate and requires fewer etching operations than a semiconductor arrangement formed using multiple masks. In some embodiments, forming the metal connect 218 and the metal contact 222 concurrently shortens a formation time as compared to a semiconductor arrangement that forms at least one of the metal contact or the metal contact before the other.

According to some embodiments, a semiconductor arrangement comprises a first active region, a second active region and a shallow trench isolation (STI) region between the first active region and the second active region. In some embodiments, a metal connect is over the first active region, the STI region and the second active region and connected to the first active region and the second active region. In some embodiments, the metal connect comprises a substantially uniform composition comprising at least one of titanium, nitride or tungsten.

According to some embodiments, a method of forming a semiconductor arrangement comprises forming a first opening over a first active region, a shallow trench isolation (STI) region and a second active region, such that the first opening exposes the first active region and the second active region and forming a second opening over a gate in the STI region, such that the second opening exposes a gate top surface of the gate. According to some embodiments, a method of forming a semiconductor arrangement further comprises forming a metal connect comprising a substantially uniform composition comprising at least one of titanium, nitride or tungsten in the first opening such that the metal connect connects the first active region to the second active region and forming a metal contact comprising a substantially uniform composition comprising at least one of titanium, nitride or tungsten in the second opening such that the metal contact is in contact with the gate.

According to some embodiments, a semiconductor arrangement comprises a first active region, a second active region and a shallow trench isolation (STI) region between the first active region and the second active region. In some embodiments, a metal connect is over the first active region, the STI region and the second active region and connected to the first active region and the second active region. In some embodiments, the metal connect comprises a substantially uniform composition comprising at least one of titanium, nitride or tungsten. In some embodiments, a gate is adjacent the metal connect and the gate is over the first active region, the STI region and the second active region and connected to the first active region and the second active region. In some embodiments, a metal contact is over the gate, the metal contact comprising a substantially uniform composition comprising titanium nitride and tungsten.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor arrangement comprising:
    forming a first set of one or more fins and a second set of one or more fins, the first set of one or more fins spaced apart from the second set of one or more fins by a first dielectric;
    forming a second dielectric over the first set of one or more fins, the second set of one or more fins, and the first dielectric;
    etching a first opening in the second dielectric, the first opening extending over the first set of one or more fins, the second set of one or more fins, and the first dielectric; and
    forming a first metal connect in the first opening, the first metal connect extending over the first set of one or more fins, the second set of one or more fins, and the first dielectric to form an electrical connection between the first set of one or more fins and the second set of one or more fins.

2. The method of claim 1, comprising:
    growing epitaxial caps over the first set of one or more fins and the second set of one or more fins to define source regions and drain regions; and
    forming a dummy gate, the dummy gate extending over the first set of one or more fins and the second set of one or more fins between the source regions and the drain regions.

3. The method of claim 2, wherein the dummy gate extends over the first dielectric.

4. The method of claim 2, wherein the second dielectric is formed after the dummy gate is formed.

5. The method of claim 2, wherein the second dielectric is formed over the epitaxial caps.

6. The method of claim 2, comprising:
    replacing the dummy gate with a gate; and
    forming a third dielectric over the second dielectric and the gate.

7. The method of claim 6, wherein:
    the etching comprises etching the third dielectric and the first opening is defined by the second dielectric and the third dielectric, and
    the method comprises etching a second opening in the third dielectric over the gate.

8. The method of claim 7, wherein the first opening and the second opening are formed concurrently using a single mask.

9. The method of claim 7, comprising:
    forming a second metal connect in the second opening.

10. The method of claim 1, comprising:
    forming a gate extending over the first set of one or more fins, the second set of one or more fins, and the first dielectric.

11. The method of claim 10, comprising:
    forming a third dielectric over the second dielectric and the gate.

12. The method of claim 11, wherein the etching comprises etching the third dielectric and the first opening is defined by the second dielectric and the third dielectric.

13. The method of claim 12, comprising:
    etching a second opening in the third dielectric over the gate; and
    forming a second metal connect in the second opening.

14. A method of forming a semiconductor arrangement comprising:
    forming a first set of one or more fins and a second set of one or more fins, the first set of one or more fins spaced apart from the second set of one or more fins by a first dielectric;
    forming a second dielectric over the first set of one or more fins, the second set of one or more fins, and the first dielectric;

forming a third dielectric over the first set of one or more fins, the second set of one or more fins, the first dielectric, and the second dielectric;

etching a first opening in the second dielectric and the third dielectric, the first opening extending over the first set of one or more fins, the second set of one or more fins, and the first dielectric;

etching a second opening in the third dielectric, the second opening extending over the first set of one or more fins, the second set of one or more fins, and the first dielectric; and forming a first metal connect in the first opening and a second metal connect in the second opening.

15. The method of claim 14, comprising:
forming a gate prior to forming the third dielectric, wherein the second opening is etched in a portion of the third dielectric overlying the gate.

16. The method of claim 15, wherein the gate extends over the first set of one or more fins, the second set of one or more fins, and the first dielectric.

17. The method of claim 14, wherein the second opening does not extend into the second dielectric.

18. The method of claim 14, comprising:
forming a dummy gate, the dummy gate extending over the first set of one or more fins, the second set of one or more fins, and the first dielectric, wherein the second dielectric is formed around the dummy gate.

19. A method of forming a semiconductor arrangement comprising:

forming a first set of one or more fins and a second set of one or more fins, the first set of one or more fins spaced apart from the second set of one or more fins by a first dielectric;

forming a dummy gate;

forming a second dielectric around the dummy gate and over the first set of one or more fins, the second set of one or more fins, and the first dielectric;

replacing the dummy gate with a gate;

forming a third dielectric over the second dielectric and the gate;

etching a first opening in the second dielectric and the third dielectric;

etching a second opening in a portion of the third dielectric overlying the gate; and forming a first metal connect in the first opening and a second metal connect in the second opening.

20. The method of claim 19, comprising growing epitaxial caps over the first set of one or more fins and the second set of one or more fins to define source regions and drain regions, wherein the first metal connect contacts a plurality of the epitaxial caps and the second metal connect contacts the gate.

* * * * *